United States Patent

Roberts

[15] 3,680,206

[45] Aug. 1, 1972

[54] ASSEMBLIES OF SEMICONDUCTOR DEVICES HAVING MOUNTING PILLARS AS CIRCUIT CONNECTIONS

[72] Inventor: John Tudor Roberts, Cheadle Hulme, Cheadle, Cheshire, England

[73] Assignee: Ferranti, Limited, Lancashire, England

[22] Filed: June 23, 1969

[21] Appl. No.: 835,556

[52] U.S. Cl. ..........................29/580, 29/589, 29/625

[51] Int. Cl. ............................B01j 17/00, H01l 5/00

[58] Field of Search........29/576, 577, 578, 580, 589, 29/590, 591, 604, 625

[56] References Cited

UNITED STATES PATENTS

| | | | |
|---|---|---|---|
| 3,518,751 | 7/1970 | Waters et al. | 29/591 |
| 3,371,148 | 2/1968 | Roques et al. | 29/577 X |
| 2,229,585 | 1/1941 | Osenberg | 29/622 |

OTHER PUBLICATIONS

Sideris, " Bumps, & Balls, Pillars & Beams" , Electronics Magazine 6/28/65 page 68, 69.

*Primary Examiner*—John F. Campbell
*Assistant Examiner*—W. Tupman
*Attorney*—Cameron, Kerkam & Sutton

[57] ABSTRACT

Mounting pillars comprising electrical connections between device contact pads on a semiconductor wafer and conductors, the conductors possibly being on a substrate member, are formed by initially forming protrusions on the substrate member, if provided, or the semiconductor wafer and depositing conductive material over the protrusions to provide respectively conductors or device contact pads having integral mounting pillars.

9 Claims, 7 Drawing Figures

Figure 1:
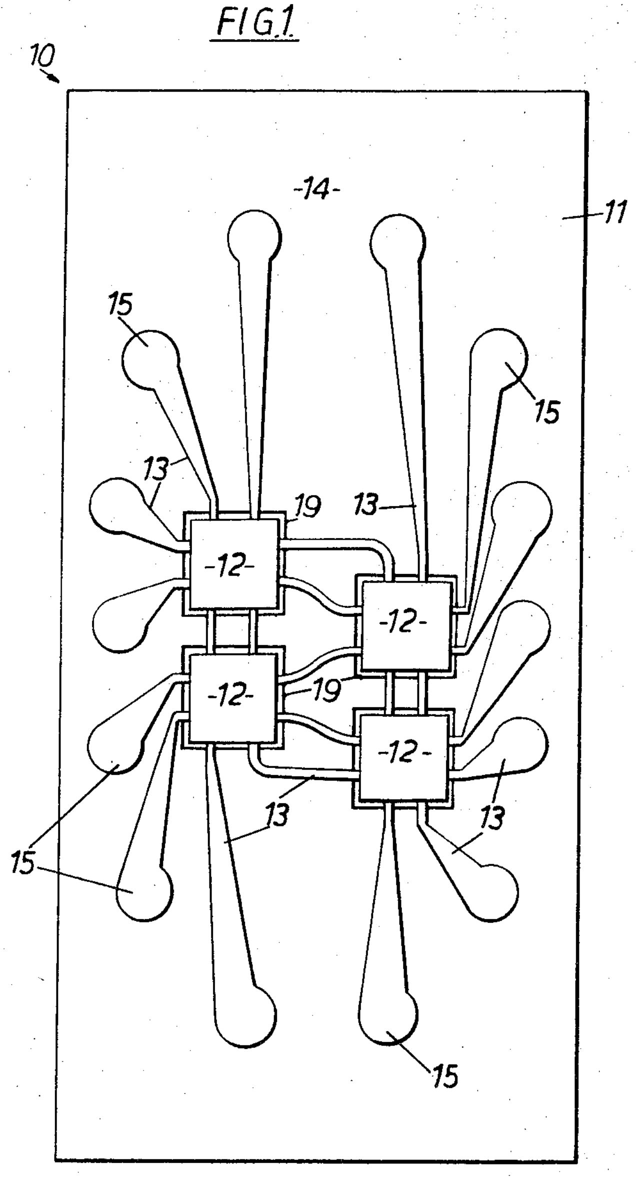

ASSEMBLIES OF SEMICONDUCTOR DEVICES HAVING MOUNTING PILLARS AS CIRCUIT CONNECTIONS

THIS INVENTION relates to semiconductor circuit assemblies having at least one discrete device comprising a semiconductor wafer with the device contact pads on one major face, the device, or each device, as the case may be, forming at least one circuit element and being mounted with the contact-bearing wafer face supported by electrical interconnections formed by mounting pillars between the device contacts and conductors, which conductors may be on a substrate member. For convenience hereinafter in this specification such a semiconductor circuit assembly will be referred to as "a semiconductor circuit assembly of the kind referred to."

It is an object of the present invention to form in a semiconductor circuit assembly of the kind referred to mounting pillars integral with the conductors or the device contact pads when these conductors or device contact pads are provided on an insulating support member comprising respectively a substrate member or a passivated semiconductor wafer device.

According to the present invention a method of manufacturing a semiconductor circuit assembly of the kind referred to includes forming mounting pillars on conductive members (as hereinafter defined) by the steps of forming protrusions on the substrate support member or on the passivated semiconductor wafer and depositing material from which the conductive members are to be formed so as to extend over these protrusions, the mounting pillars in the form of corresponding protrusions being provided on the exposed surface of the deposited conductive material.

Hereinafter in this specification and claims conductors on an insulating substrate support member, or the device contact pads on a passivated semiconductor wafer support member, if they are to have mounting pillars integrally formed thereon will be referred to as "conductive members." The conductors, whether on a substrate member or not, or the device contact pads, on which the mounting pillars are not integrally formed are referred to hereinafter in this specification as "co-operating conductive members," and are bonded to the mounting pillars by ultrasonic or thermo-compression techniques to form the desired electrical interconnections.

The conductive members having the mounting pillars integrally formed thereon may be provided by depositing a continuous layer of conductive material over the protrusions, the desired discrete conductive members being formed by selectively etching this layer. Alternatively, these conductive members may be provided by depositing the conductive material only on selected parts of the substrate member or semiconductor wafer.

The deposited conductive material may be of a uniform thickness on different parts of the substrate member or semiconductor wafer. This deposition may be at least partially by an electro-plating process.

The protrusions on the substrate member or the semiconductor wafer may be formed by selectively etching one plane surface of the substrate member or the semiconductor wafer.

When the conductors of the circuit assembly are on a substrate member, which substrate member may or may not be provided with protrusions, the conductor portions adjacent to the electrical interconnections initially may be underlayed with a layer of a different material before the other portions of the conductors are bonded to the substrate member, this material being removed before the wafer is mounted on the conductors, for example, by being etched away. In such a circuit assembly the unattached end portions of the conductors arranged to support the discrete device act as extensible beams capable of freely contracting or extending relatively with respect to the substrate member. Thus differential thermal expansion between the different component parts of the circuit assembly likely to be encountered during the normal operating conditions of the circuit assembly may be accommodated without open circuits occurring between the device contacts and the conductors.

For gold conductors formed on a thin layer of nichrome the under-layer of the conductor portions adjacent to the electrical interconnections may be of copper, and the copper may be etched with ferric chloride solution.

According to another aspect of the present invention a semiconductor circuit assembly of the kind referred to is provided with electrical interconnections comprising mounting pillars on conductive members (as hereinbefore defined), each mounting pillar comprising a protrusion on the exposed surface of a conductive member and corresponding to the form of a protrusion provided on the substrate support member or on the passivated semiconductor wafer, over which protrusion on the substrate member or on the semiconductor wafer the conductive member extends.

When the mounting pillars are formed integrally with the contact pads on the device the co-operating conductors of the circuit assembly initially may be in the form of a lead frame. The lead frame may subsequently be secured to an insulating substrate member.

When the conductors of the circuit assembly are on a substrate member, which substrate member may or may not be provided with protrusions, only the conductor portions remote from the electrical interconnections may adhere to the substrate member.

Figure 2:
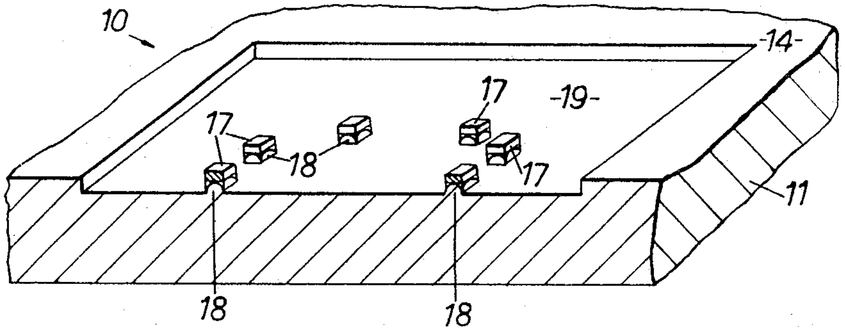
Figure 3:
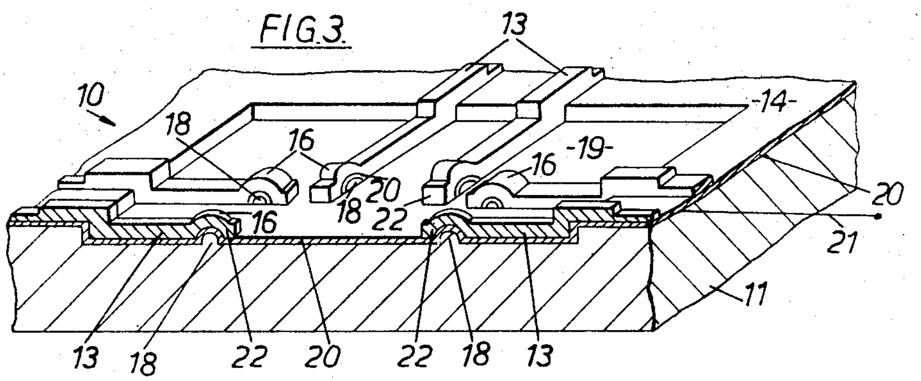
Figure 4:
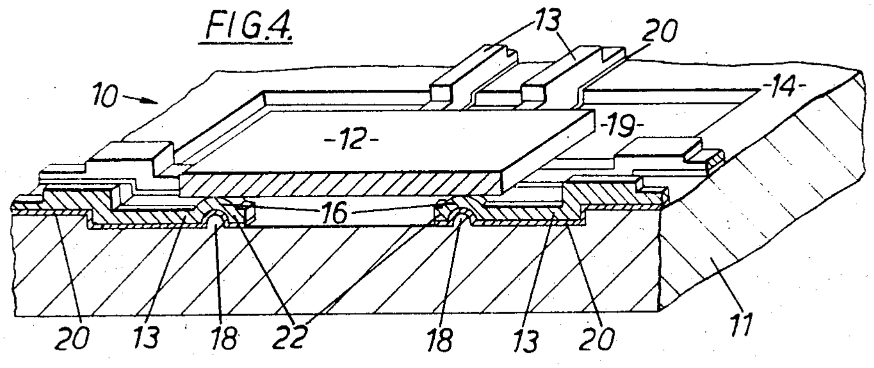
Figure 5:
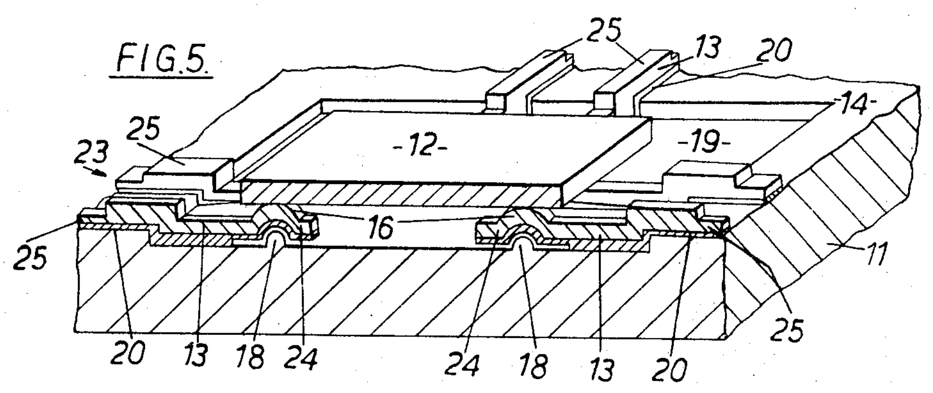
Figure 6:
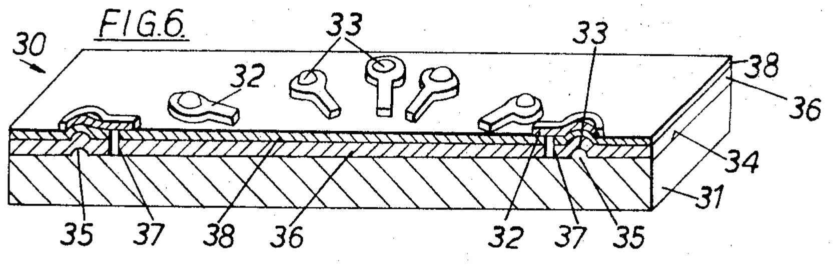
Figure 7:
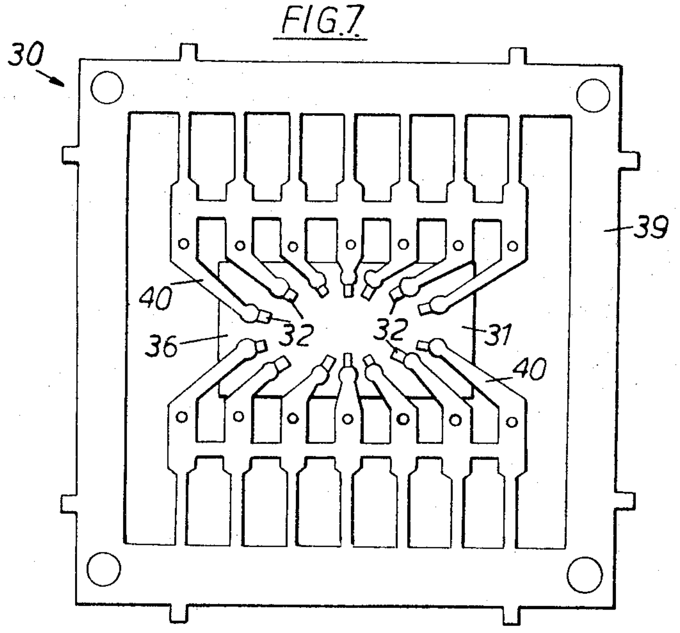

The present invention will now be described by way of example with reference to the accompanying drawings, in which FIG. 1 shows a plurality of discrete semiconductor devices mounted on conductors on a substrate member and comprising a circuit assembly, FIGS. 2 and 3 are perspective views of part of a substrate member of the circuit assembly of FIG. 1 during successive stages in the formation on the substrate member of conductors having integral mounting pillars, FIG. 4 shows a discrete semiconductor device mounted on the part of the substrate member shown in FIGS. 2 and 3, FIG. 5 is an equivalent view to that of FIG. 4 but is of a modification of the arrangement of conductors on the substrate member, FIG. 6 is a perspective view of part of a discrete passivated semiconductor device during the formation of integral mounting pillars on contact pads on the device, and FIG. 7 shows the device of FIG. 6 mounted on a lead frame.

The circuit assembly 10 shown in FIG. 1 comprises a laminar insulating substrate member 11 of glass, for example, the glass sold under the trade mark Corning 7059, and having four silicon wafers 12 mounted on conductive members, comprising gold conductors 13, on one plane surface 14 of the substrate member 11. The conductors 13 connect the wafers 12 to each other and to terminal regions 15 from which leads (not shown) extend laterally from the circuit assembly.

A part of this circuit assembly 10 is shown in FIGS. 2 and 3 during the formation of conductors 13 having integral mounting pillars 16 as indicated in FIG. 3. The wafer-bearing surface 14 of the substrate member 11 initially is covered by a layer of photo-resist material 17, for example, the material sold under the trade mark KTFR. This photo-resist material, as is shown in FIG. 2, is then selectively removed by known photo-lithographic techniques except at the spaced positions where the mounting pillars 16 are required. Protrusions 18 are formed beneath the remaining parts of the photo-resist material 17, in an etched depression 19 on the substrate surface 14, hydrofluoric acid being used as the etchant for the substrate member material. The shape of each of the protrusions 18 is arranged to correspond to the desired shape of the mounting pillars 16. The remaining portions of the photo-resist material 17 are then removed by dissolving them in trichloroethylene solution.

As shown in FIG. 3, a thin continuous composite layer of gold on nichrome is then deposited by evaporation onto the substrate surface 14, the deposited material covering the relief pattern of this surface 14 with a uniformly thick layer. A second initially continuous layer of the photo-resist material is provided on this composite layer and the photo-resist material is selectively removed by the known photo-lithographic techniques except where the conductor pattern 13 is required. The exposed gold parts are etched away by dilute aqua regia to form the conductors 13, leaving the nichrome 20 in a continuous form. The remaining portions of the photo-resist are then removed by trichloroethylene and gold is electrolytically deposited to thicken the parts of the gold conductors 13 within the etched depression 19 and on the adjacent non-etched parts of the surface 14 of the substrate member 11. This deposition is caused by immersing the substrate member 11 in an electrolyte comprising a solution of a gold salt and the continuous conductive nichrome layer 19 is connected to a lead 21. A relatively low current density is passed through the electrolyte for an extended period and the electrolyte is filtered and agitated throughout the deposition process to ensure that the gold is deposited at a uniform rate at the various requisite parts of the substrate member 11, and a temperature of 60°C is maintained. In this way gold conductors 13 of uniform thickness are formed and the deposited gold is hard in character. The conductors 13 have end portions 22 which extend over the protrusions 18 on the profiled substrate member 11 and therefore have uniform bumps on these end portions 22, the shape of the bumps corresponding to that of the protrusions 18 on the substrate member 11. These bumps comprise the mounting pillars 16 referred to above. Subsequently the exposed parts of the nichrome layer 20 not masked by the gold of the conductors 13 are etched away using ceric sulphate solution which does not attack the gold. The nichrome layer 20 facilitates the adhesion of the gold conductors 13 to the glass substrate member 11 and is essential in a continuous form for the electro-plating process described above.

In FIG. 4 a semiconductor wafer 12 is shown mounted on the mounting pillars 16 of the conductors 13 on the part of the substrate member 11 illustrated in FIGS. 2 and 3. The wafer 12 comprises a discrete device of the circuit assembly 10 and the major plane wafer face which cooperates with the mounting pillars 16 has a plurality of gold contact pads (not shown) under-layed with molybdenum. The contact pads are formed from a compositelayer deposited by evaporation of the gold and molybdenum onto a passivating layer of silicon oxide on the wafer 12. The contact pads, which extend through the silicon oxide to circuit elements such as transistors or resistors formed in the silicon wafer 12, are secured to the gold mounting pillars 16 by using ultrasonic or thermo-compression bonding techniques. The wafer 12 is accurately located on the mounting pillars 16 by employing optical magnifying means and jig arrangements.

The gold contact pads comprise the co-operating conductive members of the circuit assembly 10 and these device contact pads are secured to the conductor conductive members 13 by the mounting pillars 16 integrally formed on the conductors 13, and in this manner the desired electrical interconnections of the circuit assembly 10 are provided. The wafer device 12 is mounted on the conductors with the contact-bearing face of the wafer opposite to but spaced from the device-bearing surface 14 of the substrate member 11.

In a modification of the conductor arrangement for the circuit assembly and illustrated in FIG. 5, and in respect of which the same reference numerals are used to indicate identical or closely resembling parts to those shown in FIG. 4, the wafer device 12 of a circuit assembly 23 is supported on end portions 24 of the conductors 13 which do not adhere to the substrate member 11. In other respects the arrangement is the same as that shown in FIG. 4. This modified construction is provided by initially forming spaced copper regions (not shown) on the etched substrate surface 14 where the end portions 24 of the conductors 13 are to be deposited, these copper regions covering the protrusions 18 of the profiled substrate member 11. The spaced copper regions are formed from a continuous layer of copper deposited by sputtering on the surface 14 on the substrate member 11 and then by selectively etching this layer with ferric chloride solution in the desired manner by a known photo-lithographic process. The continuous composite gold and nichrome layer is deposited over the copper regions and the conductors 13 are formed in the same manner as that described above. When the conductors 13 are completed, but before the wafer device 12 is mounted thereon, the remaining copper is etched away by immersing the substrate member in ferric chloride solution. The portions 25 of the conductors 13 remote from the mounting pillars 16 adhere to the substrate member and the unattached end portions 24 of the conductors having the mounting pillars 16 comprise extensible beams capable of freely contracting or extending relatively with respect to the substrate member. This mounting of the wafer device 12 permits differential thermal expansions between the different components of the circuit assembly 10 which are likely to occur during normally encountered operating conditions and which expansions may cause faults such as open circuits between the device contacts and the conductors.

In another embodiment according to the present invention, and shown in FIG. 6, a circuit assembly 30 has a passivated silicon wafer device 31 with conductive members in the form of gold device contact pads 32, these contact pads 32 having gold mounting pillars 33 formed integrally therewith.

The contact-bearing face 34 of the wafer 31 is selectively etched to form protrusions 35 where it is required to form electrical interconnections between the device contact pads 32 and co-operating conductive members in the form of conductors 40 shown in FIG. 7. These protrusions 35 are formed by a photo-lithographic method similar to that described above in respect of the formation of protrusions on a glass substrate member. In this case the etchant for the silicon wafer 31 comprises a mixture of hydrofluoric acid, nitric acid and acetic acid.

The wafer face 34 having the relief pattern is then passivated by providing thereon a uniformly thick layer of silicon oxide 36. Apertures 37 are formed in this silicon oxide layer 36 by the known photo-lithographic method where it is required to make electrical contact with the circuit elements (not shown) of the wafer device 31. Onto the apertured silicon oxide layer 36, and extending through the apertures to the semiconductor material 31 underneath, there is deposited by evaporation a uniformly thick continuous composite layer of gold on molybdenum covering the profiled wafer face. This composite layer is then covered with photo-resist material which is selectively removed by the known photo-lithographic techniques except where contact pads 32 are required. The exposed gold parts are then etched away by dilute aqua regia leaving the molybdenum layer 38 intact. The remaining portions of the photo-resist are removed by trichloroethylene and gold is then electrolytically deposited on the gold on the molybdenum layer 38 to form the contact pads 32. The electro-plating process comprises immersing the wafer 31 in an electrolyte of a gold salt and the continuous molybdenum layer 38 is connected to an electrical lead (not shown). Uniformly thick contact pads 32 are formed on the passivated wafer 31 in this way and by controlling the conditions of the electro-plating process in the required manner as described above with respect to the embodiment of FIGS. 1 to 4. Thus the exposed face of each of the contact pads 32 closely conforms to the shape of a protrusion 35 on the silicon wafer 31, the uniform, bumped portions of these contact pads 32 comprising gold mounting pillars 33 integrally formed on the contact pads 32. Subsequently, the gold contact pads 32 are rendered electrically discrete by removing the continuous molybdenum layer 38 except where masked by the contact pads 32. The exposed parts of the molybdenum are etched by a mixture of phosphoric acid, nitric acid and acetic acid which does not attack the gold contact pads 32. The molybdenum beneath the gold facilitates the adhesion of the contact pads 32 to the wafer 31 and is essential in the form of a continuous layer for the electro-plating process described above.

As is shown in FIG. 7 the mounting pillars 33 then are bonded by ultrasonic or thermo-compression techniques to a lead frame 39 comprising the co-operating conductors or conductive members 40 of the circuit assembly 30. The contact pads 32 and the conductors 40 are secured together by the mounting pillars 33 integrally formed on the contact pads 32 and in this manner the desired electrical interconnections of the circuit assembly 30 are provided.

The circuit assemblies described above are completed by being protectively covered by a suitable potting compound (not shown), for example, the material sold under the trade mark STYCAST.

In the circuit assembly 30 shown in FIG. 7 the conductors 40 are unsupported except by the potting compound, and a single device 31 only is encapsulated in such a package. Alternatively, the lead frame 39 may be caused to adhere to a substrate member, in which case the circuit assembly 30 will resemble closely the circuit assembly 10 of FIGS. 2 to 4, and more than one discrete device 31 may be mounted on a common insulating substrate member in a similar manner to that shown in FIG. 1.

The provision of conductors on a substrate member may be such that only the conductor portions remote from the electrical interconnections adhere to the substrate member, as shown in FIG. 5, even though protrusions are not formed on the substrate member.

There are provided at least three, and usually sixteen or more, electrical interconnections between each semiconductor wafer and the conductor pattern in the circuit assembly of either of the embodiments, or of modifications of the embodiments,described above.

The formation of the conductors on the substrate member and of the device contact pads has been described above as comprising the selective etching of initially continuous conductive layers on the substrate member or semiconductor wafer. The conductors and/or device contact pads may also be formed by the selective deposition of the conductive material in the required pattern on the substrate member or semiconductor wafer, for example, the deposition being through a mask.

It is possible that thin film circuit elements are formed on the semiconductor wafers included in such circuit assemblies.

When the circuit assembly has more than two semiconductor wafers mutually interconnected on a common substrate member not all the semiconductor wafers need have circuit elements formed therein, the non-element-forming wafers comprising interconnection members of such a circuit assembly.

What I claim is:

1. In a method of manufacturing a semiconductor circuit assembly having at least one discrete device comprising a semiconductor wafer with the device contacts on one major face, each device forming at least one circuit element and being mounted with the contact-bearing wafer face supported by electrical interconnections comprising mounting pillars between the device contacts and conductive members on an insulative support member, the steps of selectively etching one plane surface of the insulative support member to form protrusions on the insulating support member, said protrusions being integral with and of the same insulating material as said support member, depositing a continuous layer of conductive material of uniform thickness on the support member and protrusions and selectively removing a portion of the deposited layer to form discrete conductive members and mounting pillars on the exposed surface of the deposited conductive material on the protrusions, said mounting pillars having a form corresponding to that of said protrusions.

2. A method as claimed in claim 1 in which the conductive material is deposited at least partially by an electro-plating process.

3. In a method of manufacturing a semiconductor circuit assembly having at least one discrete device comprising a semiconductor wafer with the device contacts on one major wafer face, each device forming at least one circuit element and being mounted with the contact-bearing wafer face supported by electrical interconnections comprising mounting pillars between the device contacts and conductive members on an insulative support member, the steps of forming protrusions on the insulating support member, said protrusions being integral with and of the same insulating material as said support member, and depositing on said support member conductive material from which the conductive members are to be formed, so as to extend over said protrusions and form mounting pillars on the exposed surface of the deposited conductive material, said mounting pillars having a form corresponding to that of said protrusions, forming said conductive members on the insulating support member, and further including the step of initially under-laying portions of the conductive members adjacent to the electrical interconnections with a layer of a different material before the other portions of the conductors are bonded to the support member and subsequently removing said different material before the wafer is mounted on the conductive members.

4. A method as claimed in claim 3 in which the conductive members are provided by depositing a continuous layer of conductive material over the protrusions on the support member, and selectively etching said layer.

5. A method as claimed in claim 3 in which the deposited conductive material is of a uniform thickness on different parts of the insulating support member.

6. A method as claimed in claim 3 in which the conductive material is deposited at least partially by an electro-plating process.

7. A method as claimed in claim 3 in which the protrusions on the insulating support member are formed by selectively etching one plane surface of the support member.

8. In a method of manufacturing a semiconductor circuit assembly having at least one discrete device comprising a semiconductor wafer with the device contacts on one major wafer face, each device forming at least one circuit element and being mounted with the contact-bearing wafer face supported by electrical interconnections comprising mounting pillars integral with conductors on an insulating substrate support member, the mounting pillars being between the device contacts and the conductors, the steps of forming protrusions on one plane surface of the insulating substrate member, said protrusions being integral with and of the same insulating material as said substrate member, and depositing material on said substrate from which the conductors are to be formed so as to extend over said protrusions and form mounting pillars on the exposed surface of the conductors, said mounting pillars having a form corresponding to that of said protrusions, forming said conductors on the insulating substrate and further including the step of initially underlaying portions of the conductors adjacent to the electrical interconnections with a layer of a different material before the other portions of the conductors are bonded to the substrate, said different material being subsequently removed before the wafer is mounted on the conductors.

9. A method as claimed in claim 8 in which said different material beneath the conductors is removed by etching.

10. A method as claimed in claim 8 in which the conductors are of gold on a thin layer of nichrome, the underlayer for the portions of the conductor adjacent to the electrical interconnections is of copper, and the copper is removed by being etched with ferric chloride solution.

* * * * *